(12) United States Patent
Okerman et al.

(10) Patent No.: US 9,766,282 B2
(45) Date of Patent: Sep. 19, 2017

(54) SYSTEM AND METHOD FOR SELF-TESTING A GROUND FAULT CIRCUIT INTERRUPTER

(71) Applicant: EATON CORPORATION, Cleveland, OH (US)

(72) Inventors: Jason Okerman, Hudson, OH (US); Vincent Ferri, Moon Township, PA (US); Adonna Angelika Anderson, Oak Park, MI (US)

(73) Assignee: EATON CORPORATION, Cleveland, OH (US)

( * ) Notice: Subject to any disclaimer, the term of this patent is extended or adjusted under 35 U.S.C. 154(b) by 386 days.

(21) Appl. No.: 14/541,221

(22) Filed: Nov. 14, 2014

(65) Prior Publication Data

US 2016/0139192 A1    May 19, 2016

(51) Int. Cl.
| | |
|---|---|
| *G01R 31/02* | (2006.01) |
| *H02H 3/16* | (2006.01) |
| *G01R 31/327* | (2006.01) |
| *H02H 3/33* | (2006.01) |

(52) U.S. Cl.
CPC ............ *G01R 31/025* (2013.01); *H02H 3/16* (2013.01); *G01R 31/3277* (2013.01); *H02H 3/335* (2013.01)

(58) Field of Classification Search
CPC ...... G01R 31/00; G01R 31/02; G01R 31/024; G01R 31/025; G01R 31/08; G01R 31/28; G01R 31/10; H04L 41/0677; H02H 3/16; H02H 3/105; H02H 3/335

USPC ....... 324/500, 509, 512, 527, 528, 531, 555; 361/42
See application file for complete search history.

(56) References Cited

U.S. PATENT DOCUMENTS

| | | | |
|---|---|---|---|
| 3,678,372 A * | 7/1972 | Elder | ..................... G04F 10/00 323/342 |
| 5,982,593 A | 11/1999 | Kimblin et al. | |
| 6,392,513 B1 | 5/2002 | Whipple et al. | |
| 6,473,281 B1 * | 10/2002 | Kornblit | .............. H02H 3/0935 340/650 |
| 6,720,872 B1 | 4/2004 | Engel et al. | |
| 7,215,520 B2 | 5/2007 | Elms et al. | |
| 2004/0100742 A1 * | 5/2004 | Brown | ................... H02H 3/331 361/42 |

(Continued)

*Primary Examiner* — Hoai-An D Nguyen
(74) *Attorney, Agent, or Firm* — Eckert Seamans; Philip Levy; Grant Coffield

(57) ABSTRACT

Self-test circuitry for testing a circuit interrupter includes an active element coupled to an operating mechanism, a first sub-circuit for temporarily disabling the active element, a second sub-circuit structured to generate a simulated ground fault condition, and a processing unit coupled to the ground fault detection circuitry. The first sub-circuit and the second sub-circuit, the processing unit being structured and configured to control the first sub-circuit to temporarily disable the active element and to control the second sub-circuit to generate the simulated ground fault condition when the active element is disabled. Also, self-test circuitry that includes a sub-circuit structured to generate a simulated ground fault condition and a processing unit structured and configured to control the sub-circuit to generate the simulated ground fault condition only during a predetermined portion of a half cycle of energy passing through the circuit interrupter.

30 Claims, 3 Drawing Sheets

(56) References Cited

U.S. PATENT DOCUMENTS

| | | | |
|---|---|---|---|
| 2005/0117264 A1* | 6/2005 | Aromin | H02H 3/338 361/42 |
| 2006/0098360 A1* | 5/2006 | Jones | H02H 3/335 361/42 |
| 2007/0297113 A1* | 12/2007 | Domitrovich | H02H 1/00 361/115 |
| 2008/0106268 A1* | 5/2008 | Lewinski | G01R 31/025 324/509 |
| 2012/0257314 A1 | 10/2012 | Armstrong | |

* cited by examiner

SYSTEM AND METHOD FOR SELF-TESTING A GROUND FAULT CIRCUIT INTERRUPTER

BACKGROUND

Field

The disclosed concept pertains generally to ground fault circuit interrupters (GFCIs), and, more particularly, to a system and method for self-testing the detection circuitry of a GFCI.

Background Information

Electrical circuits generally employ one or more circuit interrupters configured to disable power to a load in response to an overcurrent condition, such as an overload condition or a relatively high level short circuit or fault condition. One such circuit interrupter is a ground fault circuit interrupter (GFCI). A GFCI is a device that disables an electric circuit when it detects that current is flowing along an unintended path, such as through water or through a person. GFCIs are often used to reduce the risk of electric shock. GFCIs are available in two types for permanent installation, the circuit breaker type that may be installed in a circuit breaker panel, and the receptacle type that may be installed in a normal electrical box.

A GFCI works by measuring difference between the current leaving the hot side of the power source and the current returning to the neutral side. If the measured currents are not equal (thus making the difference zero), this means that some of the current is flowing along an unintended path, and the GFCI shuts the power off. When the problem is corrected, the GFCI can manually be reset by pushing a reset button provided as part of the GFCI.

GFCIs are covered by Underwriters Laboratory (UL) Standard UL 943. The Standard UL 943 requires that GFCI devices include a built-in test circuit including a test button which allows a user to periodically manually test the device. When the test button is depressed, a simulated ground fault current is produced that causes the GFCI device to open if the device is operating properly. The device must then be manually reset (for receptacle types, this is done by pressing the rest button to return it to service; for circuit breaker types, this is done by switching the manual handle back to ON).

It is recommended that manually testing of GFCIs be conducted at least one time per month. However, in practice, many GFCIs are not regularly manually tested for proper functionally. Thus, more recently, GFCIs have been developed that employ a self-test functionality that automates the testing process by performing a self-test periodically (e.g., without limitation, every 3 hours, every hour, or every minute) to provide an extra level of safety. Such self-test GFCIs of the receptacle type typically include a status indicator, such as one or more LEDs, to visually indicate the current status of the device (i.e., operational or not operational) so that it can be replaced in the case of a failure. For breaker type GFCIs, the breaker will de-energize (trip) circuit if a self-test does not pass.

SUMMARY

In one embodiment, a circuit interrupter is provided that includes a number of separable contacts provided between a line side and a load side of the circuit interrupter, an operating mechanism coupled to the separable contacts and structured to selectively open the separable contacts, an active element coupled to the operating mechanism, the active element being structured to enable selective actuation of the operating mechanism to open the separable contacts, ground fault detection circuitry structured to detect ground fault conditions and in response thereto generate a trip signal for causing actuation of the operating mechanism, and self-test circuitry for testing the circuit interrupter. The self-test circuitry includes a first sub-circuit coupled to the active element, the first sub-circuit being structured to temporarily disable the active element, a second sub-circuit structured to generate a simulated ground fault condition within the circuit interrupter, and a processing unit coupled to the ground fault detection circuitry, the first sub-circuit and the second sub-circuit, the processing unit being structured and configured to control the first sub-circuit to temporarily disable the active element and to control the second sub-circuit to generate the simulated ground fault condition when the active element is disabled.

In another embodiment, a method of self-testing a circuit interrupter is provided wherein the circuit interrupter includes a number of separable contacts provided between a line side and a load side of the circuit interrupter, an operating mechanism coupled to the separable contacts and structured to selectively open the separable contacts, an active element coupled to the operating mechanism, the active element being structured to enable selective actuation of the operating mechanism to open the separable contacts, and ground fault detection circuitry structured to detect ground fault conditions and in response thereto generate a trip signal for causing actuation of the operating mechanism. The method in this embodiment includes temporarily disabling the active element, generating a simulated ground fault condition within the circuit interrupter when the active element is disabled, and testing operation of the ground fault detection circuitry in response to the simulated ground fault condition.

In yet another embodiment, a circuit interrupter is provided that includes a number of separable contacts provided between a line side and a load side of the circuit interrupter, an operating mechanism coupled to the separable contacts and structured to selectively open the separable contacts, an active element coupled to the operating mechanism, the active element being structured to enable selective actuation of the operating mechanism to open the separable contacts, ground fault detection circuitry structured to detect ground fault conditions and in response thereto generate a trip signal provided to the active element, and self-test circuitry for testing the circuit interrupter. The self-test circuitry includes a sub-circuit structured to generate a simulated ground fault condition within the circuit interrupter, and a processing unit coupled to the ground fault detection circuitry and the sub-circuit, the processing unit being structured and configured to control the sub-circuit to generate the simulated ground fault condition only during a predetermined portion of a half cycle of energy passing through the circuit interrupter such that the trip signal generated in response to the simulated ground fault will not be sufficient to cause actuation of the operating mechanism in a manner which will open the separable contacts.

In still another embodiment, a method of self-testing a circuit interrupter is provided, wherein the circuit interrupter includes a number of separable contacts provided between a line side and a load side of the circuit interrupter, an operating mechanism coupled to the separable contacts and structured to selectively open the separable contacts, an active element coupled to the operating mechanism, the active element being structured to enable selective actuation of the operating mechanism to open the separable contacts, and ground fault detection circuitry structured to detect ground fault conditions and in response thereto generate a trip signal for causing actuation of the operating mechanism. In this embodiment, the method includes generating a simulated ground fault condition within the circuit interrupter only during a predetermined portion of a half cycle of energy passing through the circuit interrupter such that the trip signal generated in response to the simulated ground fault will not be sufficient to cause actuation of the operating mechanism in a manner which will open the separable contacts, and testing operation of the ground fault detection circuitry in response to the simulated ground fault condition.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
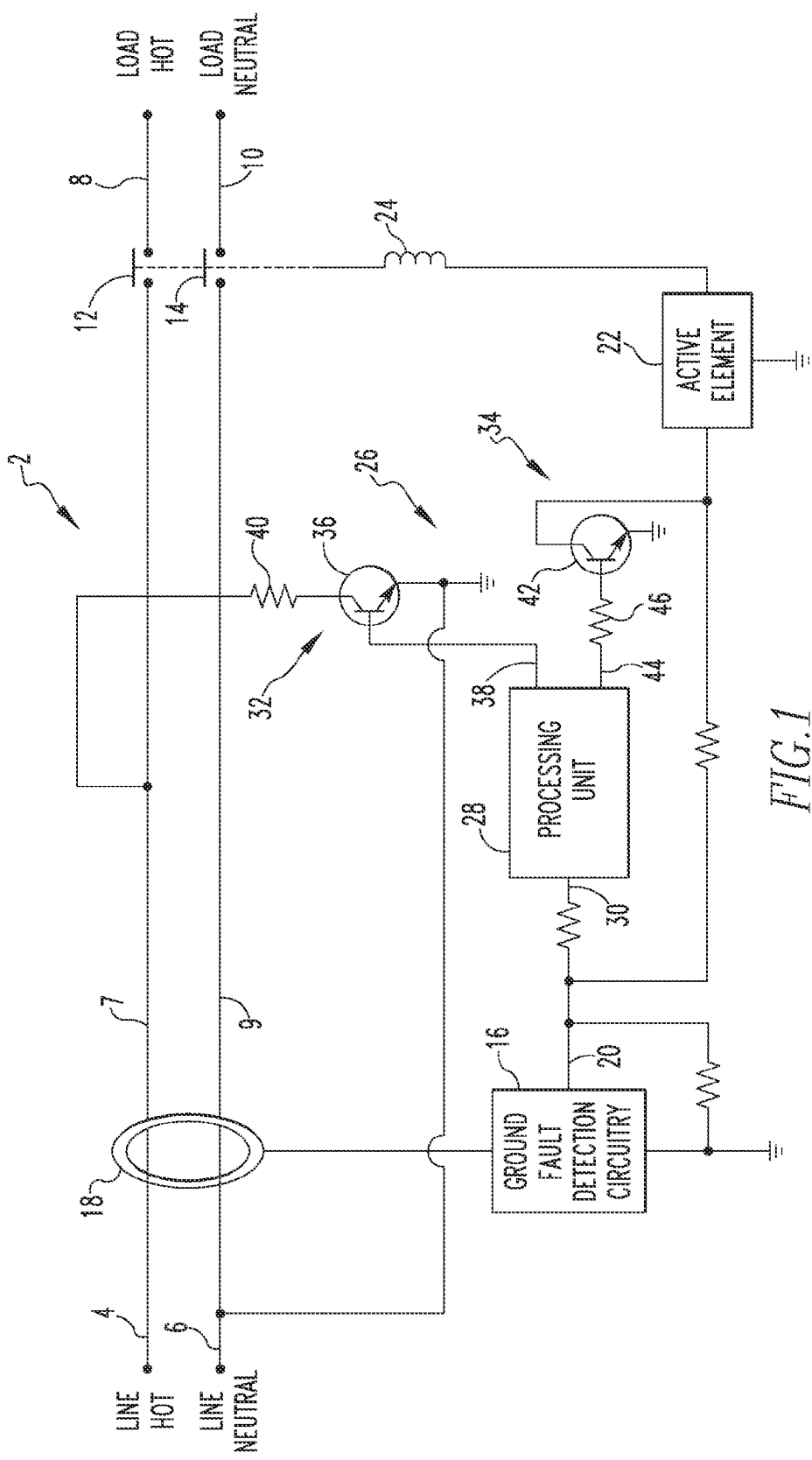
FIG. 1 is a schematic diagram of a ground fault circuit interrupter (GFCI) that implements a novel self-testing methodology according to a first embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the term "active element" shall mean an electronic component that supplies energy to and/or controls the flow of energy within a circuit.

FIG. 1 is a schematic diagram of a ground fault circuit interrupter (GFCI) 2 that implements a novel self-testing methodology according to a first embodiment of the disclosed concept. GFCI 2 may be implemented as a circuit breaker installed in a circuit breaker panel or as a receptacle installed in an electrical box.

GFCI 2 includes a line hot terminal 4, a line neutral terminal 6, a load hot terminal 8 and a load neutral terminal 10. A hot conductor 7 is provided between line hot terminal 4 and load hot terminal 8, and a neutral conductor 9 is provided between line neutral terminal 6 and load neutral terminal 10. In addition, a first separable contact 12 is provided between line hot terminal 4 and load hot terminal 8, and a second separable contact 14 is provided between line neutral terminal 6 and load neutral terminal 10. As described elsewhere herein, first separable contact 12 and second separable contact 14 are each structured to be opened in response to the detection of a ground fault condition by GFCI 2.

GFCI 2 further includes ground fault detection circuitry 16 for detecting a ground fault condition in the electrical system to which GFCI 2 is coupled. In the exemplary, non-limiting embodiment, ground fault detection circuitry 16 employs the well-known dormant oscillator technique for sensing a load side grounded-neutral. Ground fault detection circuitry 16 thus employs a differential current transformer 18 which is operatively coupled to hot conductor 7 and neutral conductor 9 and produces an output proportional to the difference in the current flowing to a load through hot conductor 7 and the current returning from the load through neutral conductor 6. Based on this differential current, ground fault detection circuitry 16 is structured to determine whether a ground fault condition exists in the circuit to which GFCI 2 is coupled. When ground fault detection circuitry 16 detects a ground fault condition, it will output a ground fault trip signal on a GFCI output line 20.

GFCI 2 further includes an active element 22 that is coupled to the output of ground fault detection circuitry 16 to receive the ground fault trip signal provided on GFCI output line 20. In the exemplary embodiment, active element 22 is a TRIAC. It will be understood, however, that active element may be another type of active element such as another type of bidirectional active element or a unidirectional active element such as a silicon-controlled rectifier (SCR). The output of active element 22 is coupled to a solenoid 24 which, when energized, is structured to open first separable contact 12 and second separable contact 14. Thus, in operation, when ground fault detection circuitry 16 detects a ground fault condition, it will output a ground fault trip signal on GFCI output line 20 as described above. That ground fault trip signal is provided to and activates active element 22, which in turn causes solenoid 24 to be energized and open first separable contact 12 and second separable contact 14, thereby providing ground fault protection to any connected circuitry and/or individuals.

GFCI 2 further includes self-test circuitry 26 for enabling a self-test procedure to be performed by GFCI 2. Self-test circuitry 26 includes a processing unit 28 having a listener pin 30 that is connected to GFCI output line 22 to detect the status of GFCI output line 22, a hardware sub-circuit 32 controlled by processing unit 28 which is structured to create a simulated ground fault condition in GFCI 2, and a hardware sub-circuit 34 controlled by processing unit 28 which is structured to be able to selectively disable active element 22 for a short period of time (for example, and without limitation, typically less than or equal to one half cycle, one half cycle, a multiple of consecutive have cycles, or a multiple of non-consecutive have cycles). Processing unit 28 may be, for example and without limitation, a microprocessor, a microcontroller, a programmable logic controller, or any other type of suitable processing device. In the exemplary embodiment, hardware sub-circuit 32 includes a bipolar junction transistor (BJT) 36 (or, alternatively, another type of electronic switching element). As seen in FIG. 1, the base of BJT 36 is connected to an output pin 38 of processing unit 28, the collector of BJT 36 is connected to hot conductor 7 through a limit resistor 40 (downstream of differential current transformer 18), and the emitter of BJT 36 is connected to neutral conductor 9 (upstream of differential current transformer 18) and ground. Also in the exemplary embodiment, hardware sub-circuit 34 includes a BJT 42 (or, alternatively, another type of electronic switching element). As seen in FIG. 1, the base of BJT 42 is connected to an output pin 44 of processing unit 28 through a limit resistor 46, the collector of BJT 42 is coupled to GFCI output line 20, and the emitter of BJT 42 is connected to ground.

Figure 2:
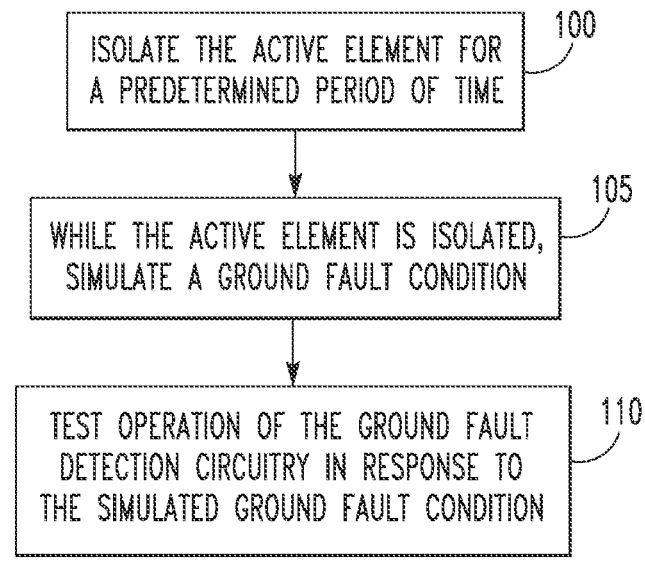
FIG. 2 is a flowchart illustrating the operation of the GFCI of FIG. 1 according to one exemplary embodiment.

In operation, self-test circuitry 26 is structured and configured to periodically (e.g., without limitation, once every minute) perform a self-test of GFCI 2. Such operation is described below and shown in the flowchart of FIG. 2. Referring to FIGS. 1 and 2, when a self-test is to be performed, processing unit 28 first outputs a signal onto output pin 44 for a predetermined period of time (for example, less than or equal to one half cycle). The signal output onto output pin 44 activates BJT 34. When BJT 34 is activated in this manner, it provides a bypass path to ground for any ground fault trip signal that may be provided on GFCI output line 20, thereby temporarily isolating the input of active element 22 (see step 100 of FIG. 2). When active element 22 is so isolated, solenoid 24 cannot be energized and first separable contact 12 and second separable contact 14 cannot be opened. Next, while active element 22 is isolated as just described, processing unit 38 outputs a signal onto output pin 38 which activates hardware sub-circuit 32 and thereby causes a simulated ground fault to occur within GFCI 2 (see step 105 of FIG. 2). Processing unit 28 is thus able to test the response of ground fault detection circuitry 16 to the simulated ground fault condition using, without limitation, listener pin 30 (see step 110 of FIG. 2). After the self-test has been performed, the signal output onto pin 44 is removed, thereby enabling active element 22 and solenoid 24 for normal operation. In one particular embodiment, self-test circuitry 26 would also include a watchdog sub-circuit which guarantees that ground fault protection is restored after a brief period of time (for example, one half cycle) in order to maintain ground fault trip timing requirements.

Figure 3:
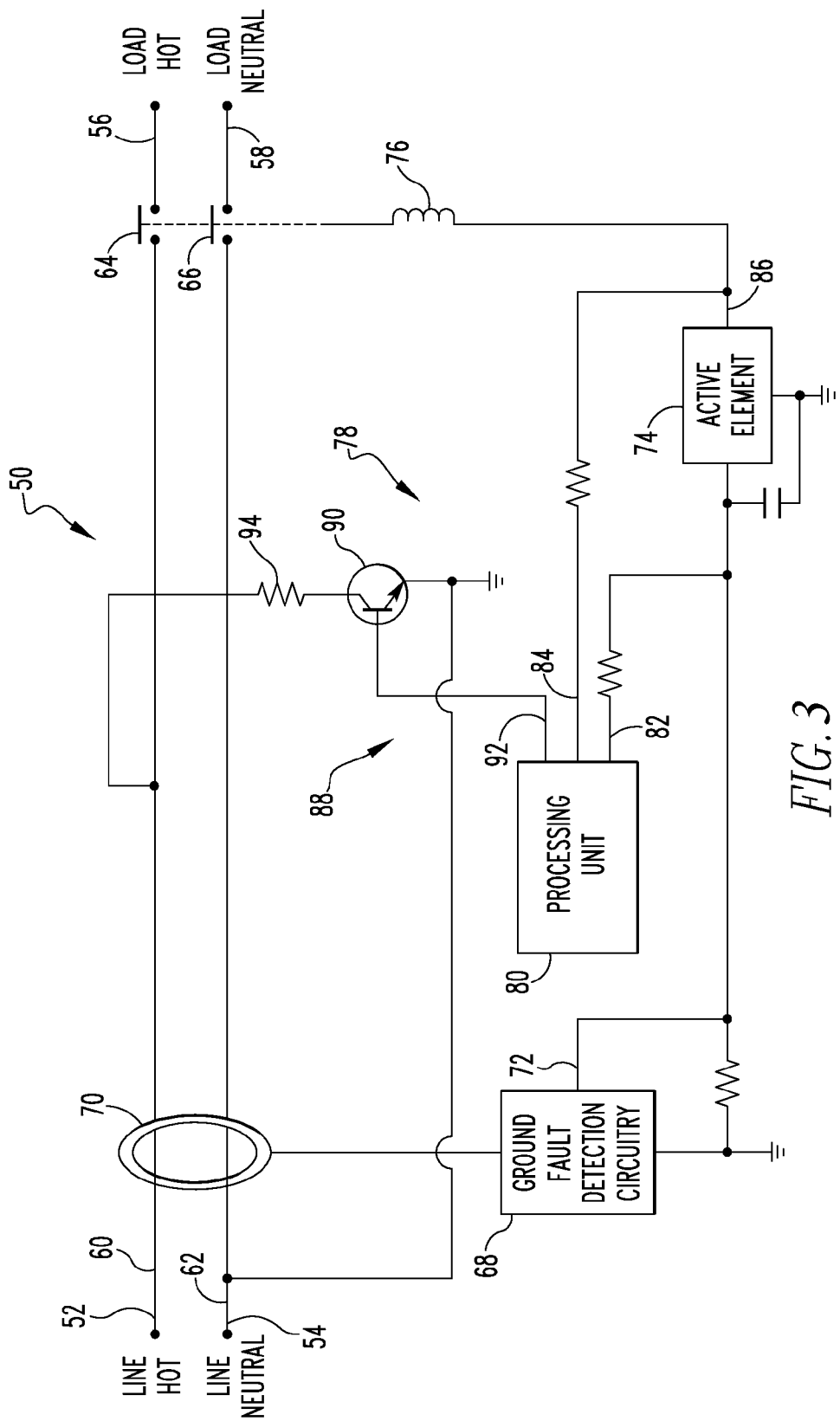
FIG. 3 is a schematic diagram of a ground fault circuit interrupter (GFCI) that implements a novel self-testing methodology according to a second, alternative embodiment of the disclosed concept.

FIG. 3 is a schematic diagram of a ground fault circuit interrupter (GFCI) 50 that implements a novel self-testing methodology according to a second, alternative embodiment of the disclosed concept. GFCI 50 may be implemented as a circuit breaker installed in a circuit breaker panel or as a receptacle installed in an electrical box.

GFCI 50 includes a line hot terminal 52, a line neutral terminal 54, a load hot terminal 56, and a load neutral terminal 58. A hot conductor 60 is provided between line hot terminal 52 and load hot terminal 56, and a neutral conductor 62 is provided between line neutral terminal 54 and load neutral terminal 58. In addition, a first separable contact 64 is provided between line hot terminal 52 and load hot terminal 56, and a second separable contact 66 is provided between line neutral terminal 54 and load neutral terminal 58. As described elsewhere herein, first separable contact 64 and second separable contact 66 are each structured to be opened in response to the detection of a ground fault condition by GFCI 50.

GFCI 50 further includes ground fault detection circuitry 68, which is similar to ground fault detection circuitry 16 described elsewhere herein, for detecting a ground fault condition in the electrical system to which GFCI 50 is coupled. Like ground fault detection circuitry 16, ground fault detection circuitry 68 employs a differential current transformer 70 which is operatively coupled to hot conductor 60 and neutral conductor 62 and produces an output proportional to the difference in the current flowing to a load through hot conductor 60 and the current returning from the load through neutral conductor 62. Based on this differential current, ground fault detection circuitry 68 is structured to determine whether a ground fault condition exists in the circuit to which GFCI 50 is coupled. When ground fault detection circuitry 68 detects a ground fault condition, it will output a ground fault trip signal on a GFCI output line 72.

GFCI 50 further includes an active element 74, which may be a bidirectional active element such as a TRIAC or a unidirectional active element such as an SCR. In the exemplary embodiment, active element 74 is a TRIAC. Active element 74 is coupled to GFCI output line 72 to receive the ground fault trip signals that are generated thereby. The output of active element 74 is coupled to a solenoid 76 which, when energized, is structured to open first separable contact 64 and second separable contact 66. Thus, in operation, when ground fault detection circuitry 68 detects a ground fault condition, it will output a ground fault trip signal on GFCI output line 72 as described above. The ground fault trip signal is provided to an activates active element 74, which in turn causes solenoid 76 to be energized and open first separable contact 64 and second separable contact 66, thereby providing ground fault protection to any connected circuitry and/or individuals.

GFCI 50 further includes alternative self-test circuitry 78 for enabling a self-test procedure to be performed by GFCI 50. Self-test circuitry 78 includes a processing unit 80 which is similar to processing unit 28 described elsewhere herein. Processing unit 80 includes a first listener pin 82 connected to GFCI output line 72 to listen to its status, and a second listener pin 84 connected to the anode 86 of active element 74 to listen to its status. Self-test circuitry 78 further includes a hardware sub-circuit 88 controlled by processing unit 80 which is structured to create a simulated ground fault condition in GFCI 50. In the exemplary embodiment, hardware sub-circuit 88 includes a bipolar junction transistor (BJT) 90 (or, alternatively, another type of electronic switching element), wherein the base of BJT 90 is connected to an output pin 92 of processing unit 80, the collector of BJT 90 is connected to hot conductor 60 through a limit resistor 94 (downstream of differential current transformer 70), and the emitter of BJT 90 is connected to neutral conductor 62 (upstream of differential current transformer 70) and ground.

In this embodiment, processing unit 80 is structured and configured to cause sub-circuit 88 to create a simulated ground fault only during a predetermined portion of the latter part of one half cycle of the energy being provided through GFCI 50 such that the energy in the simulated ground fault is enough to trigger a ground fault detection circuitry 68, and thus the generation of a ground fault trip signal as described herein, but is not enough (i.e., the duration is not long enough) to fully activate solenoid 76 in a manner that would open first separable contact 64 and second separable contact 66. In other words, the activation of sub-circuit 88 and the resulting ground fault simulation signal is carefully timed during the cycles of the energy carried through GFCI 50 such that it will trigger ground fault detection circuitry 68 but will not result in full actuation of solenoid 76 (therefore keeping the separable contacts closed). As will be appreciated, the particular timing and duration of the ground fault simulation by sub-circuit 88 will be based upon the mechanical and magnetic properties of solenoid 76 and may be determined empirically. For example, and without limitation, each half cycle of the energy through GFCI 50 may be divided into sixteen time divisions, with the simulated ground fault only being generated during the last three time divisions of the half cycle so as to not generate sufficient energy to fully activate solenoid 76. It will be appreciated that these specific parameters are for reference only and that an actual design may differ. Also, the particulars of where in the half cycle the simulation is provided and for how long the simulation is provided will be based on the particular properties of solenoid 76 and will need to be determined in advance of operation of GFCI 50.

Figure 4:
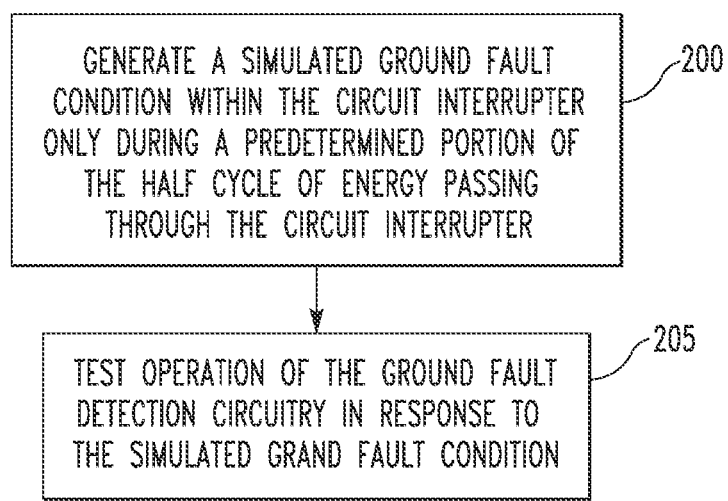
FIG. 4 is a flowchart illustrating the operation of the GFCI of FIG. 3 according to one exemplary embodiment.

Thus, in operation, self-test circuitry 78 is structured and configured to periodically (e.g., without limitation, once every minute) perform a self-test of GFCI 50. Such operation is described below and shown in the flowchart of FIG. 4. Referring to FIGS. 3 and 4, when a self-test is to be performed, processing unit 80 will activate sub-circuit 88 at the predetermined time and for the predetermined duration so as to create the simulated ground fault described above. This will not result in the opening of first separable contact 64 and second separable contact 66, but will cause a fault that should be detected by ground fault detection circuitry 68 (see step 200 of FIG. 4). Processing unit 80 may then measure the output on GFCI output line 72 through listener pin 82 and the state of anode 86 through listener pin 84 in order to test the functioning of GFCI 50 (see step 205 of FIG. 4).

As noted elsewhere herein, ground fault circuit interrupters may be implemented as circuit breakers or receptacles. However, the UL self-testing standards differ depending upon whether the GFCI is implemented as a circuit breaker or a receptacle. In particular, for both circuit breaker and receptacle implementations, the standards require that the proper functioning and behavior of the ground fault detection circuitry be verified. For receptacles, however, the UL standards are stricter and also require that the proper behavior of the "active tripping elements", i.e. the active element and solenoid, also be verified. Thus, the embodiment of FIG. 1 (GFCI 2) would be sufficient for breaker implementations but not receptacle implementations because it only monitors the functioning of ground fault detection circuitry 16. The implementation of FIG. 3 would be proper for both breaker and receptacle implementations, since it monitors both ground fault detection circuitry 68 and the functioning of active element 74 and solenoid 76. In a further alternative, GFCI 50 may be modified such that it includes only listener pin 82 not listener pin 84. Such a modified implementation would be sufficient for breaker implementations but not for receptacle implementations since it would only monitor the functioning of ground fault detection circuitry 68.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter, comprising:
    a number of separable contacts provided between a line side and a load side of the circuit interrupter;
    an operating mechanism coupled to the separable contacts and structured to selectively open the separable contacts;
    an active element coupled to the operating mechanism, the active element being structured to enable selective actuation of the operating mechanism to open the separable contacts;
    ground fault detection circuitry structured to detect ground fault conditions and in response thereto generate a trip signal for causing actuation of the operating mechanism; and
    self-test circuitry for testing the circuit interrupter, the self-test circuitry including:
        a first sub-circuit coupled to the active element, the first sub-circuit being structured to temporarily disable the active element;
        a second sub-circuit structured to generate a simulated ground fault condition within the circuit interrupter; and
        a processing unit coupled to the ground fault detection circuitry, the first sub-circuit and the second sub-circuit, the processing unit being structured and configured to control the first sub-circuit to temporarily disable the active element and to control the second sub-circuit to generate the simulated ground fault condition when the active element is disabled.

2. The circuit interrupter according to claim 1, wherein the first sub-circuit is structured to temporarily disable the active element under control of the processing unit by creating a bypass path to ground for the trip signal.

3. The circuit interrupter according to claim 2, wherein the ground fault detection circuitry is connected to the active element by an output line, the trip signal being provided on the output line, and wherein the first sub-circuit includes an electronic switch connected to the processing unit, the output line and ground, wherein when the electronic switch is activated the bypass path to ground is created.

4. The circuit interrupter according to claim 3, wherein the electronic switch is a bipolar junction transistor, wherein a base of the bipolar junction transistor is connected to an output of the processing unit, a collector of the bipolar junction transistor is connected to the output line, and an emitter of the bipolar junction transistor is connected to ground.

5. The circuit interrupter according to claim 1, wherein a hot conductor and a neutral conductor are provided between the line side and the load side, wherein a current transformer is connected to the hot conductor and the neutral conductor, the current transformer being connected to the ground fault detection circuitry, wherein the second sub-circuit includes a switching element having a first terminal connected to an output of the processing unit, a second terminal connected to the hot conductor, and a third terminal connected to the neutral conductor and ground.

6. The circuit interrupter according to claim 5, wherein the second terminal is connected to the hot conductor at a location downstream of the current transformer and the third terminal is connected to the neutral conductor at a location upstream of the current transformer.

7. The circuit interrupter according to claim 5, wherein the switching element is a bipolar junction transistor, wherein the first terminal is a base of the bipolar junction transistor, the second terminal is a collector of the bipolar junction transistor, and the third terminal is an emitter of the bipolar junction transistor.

8. The circuit interrupter according to claim 1, wherein the active element is a bidirectional active element.

9. The circuit interrupter according to claim 8, wherein the active element is a TRIAC.

10. The circuit interrupter according to claim 1, wherein the operating mechanism is a solenoid.

11. The circuit interrupter according to claim 1, wherein the processing unit is structured and configured to disable the active element for a predetermined period of time that is less than or equal to one half cycle of energy passing through the circuit interrupter.

12. A method of self-testing a circuit interrupter, wherein the circuit interrupter includes a number of separable contacts provided between a line side and a load side of the circuit interrupter, an operating mechanism coupled to the separable contacts and structured to selectively open the separable contacts, an active element coupled to the operating mechanism, the active element being structured to enable selective actuation of the operating mechanism to open the separable contacts, and ground fault detection circuitry structured to detect ground fault conditions and in response thereto generate a trip signal for causing actuation of the operating mechanism, the method comprising:

temporarily disabling the active element;
generating a simulated ground fault condition within the circuit interrupter when the active element is disabled; and
testing operation of the ground fault detection circuitry in response to the simulated ground fault condition.

13. The method according to claim 12, wherein the temporarily disabling the active element comprises creating a bypass path to ground for the trip signal.

14. The method according to claim 12, wherein the active element is disabled for a predetermined period of time that is less than or equal to one half cycle of energy passing through the circuit interrupter.

15. A circuit interrupter, comprising:
a number of separable contacts provided between a line side and a load side of the circuit interrupter;
an operating mechanism coupled to the separable contacts and structured to selectively open the separable contacts;
an active element coupled to the operating mechanism, the active element being structured to enable selective actuation of the operating mechanism to open the separable contacts;
ground fault detection circuitry structured to detect ground fault conditions and in response thereto generate a trip signal provided to the active element; and
self-test circuitry for testing the circuit interrupter, the self-test circuitry including:
a sub-circuit structured to generate a simulated ground fault condition within the circuit interrupter; and
a processing unit coupled to the ground fault detection circuitry and the sub-circuit, the processing unit being structured and configured to control the sub-circuit to generate the simulated ground fault condition only during a predetermined portion of a half cycle of energy passing through the circuit interrupter such that the trip signal generated in response to the simulated ground fault will not be sufficient to cause actuation of the operating mechanism in a manner which will open the separable contacts.

16. The circuit interrupter according to claim 15, wherein the ground fault detection circuitry is connected to the active element by an output line, the trip signal being provided on the output line, and wherein the processing unit is connected to the output line.

17. The circuit interrupter according to claim 16, wherein the processing unit is further connected to an anode of the active element.

18. The circuit interrupter according to claim 15, wherein the processing unit is connected to an anode of the active element.

19. The circuit interrupter according to claim 15, wherein the predetermined portion of the half cycle is a predetermined latter portion of the half cycle.

20. The circuit interrupter according to claim 15, wherein a hot conductor and a neutral conductor are provided between the line side and the load side, wherein a current transformer is connected to the hot conductor and the neutral conductor, the current transformer being connected to the ground fault detection circuitry, wherein the sub-circuit includes a switching element having a first terminal connected to an output of the processing unit, a second terminal connected to the hot conductor, and a third terminal connected to the neutral conductor and ground.

21. The circuit interrupter according to claim 20, wherein the second terminal is connected to the hot conductor at a location downstream of the current transformer and the third terminal is connected to the neutral conductor at a location upstream of the current transformer.

22. The circuit interrupter according to claim 20, wherein the switching element is a bipolar junction transistor, wherein the first terminal is a base of the bipolar junction transistor, the second terminal is a collector of the bipolar junction transistor, and the third terminal is an emitter of the bipolar junction transistor.

23. The circuit interrupter according to claim 15, wherein the active element is a bidirectional active element.

24. The circuit interrupter according to claim 23, wherein the active element is a TRIAC.

25. The circuit interrupter according to claim 15, wherein the operating mechanism is a solenoid.

26. A method of self-testing a circuit interrupter, wherein the circuit interrupter includes a number of separable contacts provided between a line side and a load side of the circuit interrupter, an operating mechanism coupled to the separable contacts and structured to selectively open the separable contacts, an active element coupled to the operating mechanism, the active element being structured to enable selective actuation of the operating mechanism to open the separable contacts, and ground fault detection circuitry structured to detect ground fault conditions and in response thereto generate a trip signal for causing actuation of the operating mechanism, the method comprising:

generating a simulated ground fault condition within the circuit interrupter only during a predetermined portion of a half cycle of energy passing through the circuit interrupter such that the trip signal generated in response to the simulated ground fault will not be sufficient to cause actuation of the operating mechanism in a manner which will open the separable contacts; and
testing operation of the ground fault detection circuitry in response to the simulated ground fault condition.

27. The method according to claim 26, wherein the predetermined portion of the half cycle is a predetermined latter portion of the half cycle.

28. The method according to claim 26, wherein the ground fault detection circuitry is connected to the active element by an output line, the trip signal being provided on the output line, and wherein the testing operation comprises monitoring a status of the output line.

29. The method according to claim 28, wherein the testing operation further comprises monitoring an anode of the active element.

30. The method according to claim 26, wherein the testing operation comprises monitoring an anode of the active element.

* * * * *